United States Patent

Marantette et al.

[11] 4,012,148
[45] Mar. 15, 1977

[54] PROJECTION SCOPE AND POSITIONING SYSTEM

[76] Inventors: William F. Marantette; Ruth B. Marantette, both of 20624 Earl St., Torrance, Calif. 90503

[22] Filed: Dec. 15, 1975

[21] Appl. No.: 640,494

[52] U.S. Cl. .......................... 356/172; 250/203 R; 356/247
[51] Int. Cl.² .................. G01B 11/26; G02B 27/34
[58] Field of Search .................. 356/116, 172, 247; 250/203 R; 83/365

[56] References Cited

UNITED STATES PATENTS

| | | | |
|---|---|---|---|
| 2,628,528 | 2/1953 | Dietrich et al. | 356/166 |
| 2,737,080 | 3/1956 | Mottu | 356/166 |
| 3,293,439 | 12/1966 | Marantette et al. | 250/203 |
| 3,486,024 | 12/1969 | Astheimer | 250/203 R |
| 3,739,247 | 6/1973 | Yamaguchi et al. | 356/172 |

OTHER PUBLICATIONS

Birbeck et al. "A Gallium Arsenide Laser Rangefinder used as an Aircraft Altimeter," Jr. Sci. Instruments, 1965, pp. 541–542.

*Primary Examiner*—John K. Corbin
*Assistant Examiner*—Wm. H. Punter
*Attorney, Agent, or Firm*—Ralph B. Pastoriza

[57] ABSTRACT

A system for providing exact centering of an art work target at a given point to thereby provide exact positioning of a printed circuit board to be drilled, by way of example, combines visual as well as automatic electronic means for effecting the centering. The art work target in the form of an annular opaque pad with a clear center is projected onto a rear projection screen on which there are provided X and Y orthogonal axes the intersection point of which defines the exact point for centering of the art work target. Elongated photo cells are positioned quadrilaterally about the intersection point on the orthogonal axes, part of each of the photo cells lying in the opaque area of the target and the remaining portions lying in the clear center portion of the target. Shadows cast by these photo cells are visible on the rear projection screen so that a viewer can observe precisely what the photo cells "see." When the target image is precisely centered at the intersection point of the orthogonal axes, all of the signals from the photo cells will be equal. By utilizing difference signals between opposite photo cells aligned with X axis to drive an X servo motor and difference signals between the photo cells aligned on the Y axis to drive a Y servo motor, a table supporting the art work can be automatically moved in the X and Y directions to effect the desired precise centering automatically.

7 Claims, 6 Drawing Figures

PROJECTION SCOPE AND POSITIONING SYSTEM

This invention relates generally to a combined projection scope and positioning system and more particularly to a method and apparatus enabling the precise center positioning of a positive art work target to properly locate a circuit board for hole drilling purposes.

BACKGROUND OF THE INVENTION

In our previous U.S. Pat. Nos. 3,293,439 and 3,716,716 there are disclosed electrical control arrangements for enabling the automatic centering of a hole location on a printed circuit board precisely at designated coordinate points for drilling. In these systems, a table is arranged to be moved in the direction of X and Y orthagonal axes by X and Y servo motors. This table supports the printed circuit board and also an art work positive film upon which the exact hole locations to be drilled on the board are designated. A light projected up through the film onto a photo cell on the other side of the film provides an arrangement for detecting the hole location. Exact centering is accomplished by providing a four element electronically switched photo-sensitive resistance element, the four elements being spaced about the exact center such that when the signals across the photo sensitive resistance are all equal, exact centering has been accomplished. Another means as discussed in the afore-mentioned patents utilizes a rotating photo cell for time sharing sampling about the periphery of the art work to thereby locate the exact center when the output signal is uniform over a 360° rotation. In both instances, the generated signals are amplified and utilized to drive the servo motors minute distances to effect the exact positioning of the circuit board itself for proper drilling.

Other centering systems utilize a projection means wherein the art work target is magnified several times and projected onto a screen having orthagonal X and Y axes the intersection point of which constitutes the exact center. The table and art work can then be shifted slightly while viewing the screen to effect an exact registration of the projected magnified target with the center or intersection point of the orthagonal axes.

BRIEF DESCRIPTION OF THE PRESENT INVENTION

The present invention has as its primary object to provide electrical output signals from both X and Y axes to indicate deviations from the accurate center position of an art work target and thereby provide signals for use by X and Y servo motors for automatic centering. The preferred application is that of centering a circuit board at a precise location for drilling purposes. However, the method and apparatus of this invention can be utilized in any situation wherein it is desired to automatically provide an exact centering.

Unlike our heretofore mentioned systems as disclosed in our previously indicated patents, the present invention utilizes four static but positionally adjustable photo cells connected differentially in pairs, a pair for X axis positioning and a pair for Y axis positioning. Further, these photo cells are arranged in combination with a viewing scope such that the positions of the photo cells are visible on the screen; that is, they are positioned slightly downbeam of a rear projection screen such that they cast a shadow superimposed on the projected image of the art work target. By this arrangement, an operator can visually see what the photo cells are "seeing" during the centering operation.

The viewing screen itself includes X and Y orthagonal axes which intersect at the defined exact center point on which it is desired to locate the projected target. The projected art work target itself is in the form of an annular opaque pad with a clear center. By quadrilaterally positioning the photo cells such that a portion of each cell lies in the opaque pad area and the remaining portion in the clear area, and by assuring that the four cells are all exactly equally spaced from the intersection point of the orthagonal axes, it will be evident that when the photo responsive signals generated by the cells are all equal, the target is properly centered. On the other hand, any deviation of position of the target from the intersection point of the orthagonal axes results in some of the cells receiving more light than others to thereby generate signals which in turn are amplified and operate the X and Y servo motors to move the table and thus the art work in a direction relative to the projection scope to null the various signals so that automatic centering is assured.

BRIEF DESCRIPTION OF THE DRAWINGS

A better understanding of this invention and its various further features and advantages will be had by now referring to the accompanying drawings in which.

DETAILED DESCRIPTION OF THE INVENTION

In accord with the method of this invention, an art work target in the form of an annular opaque pad having a transparent center is automatically positioned at the precise center of a given point in such a manner that the centering operation may be visually viewed. The basic steps of the method include projecting an image of the art work target onto a rear projection screen; positioning two pairs of identical elongated photo cells along two X and Y orthogonal axes respectively at points all equally spaced a given distance from the intersection point of the orthogonal axes so that the photo cells in the pair on the X axis are equally spaced on either side of the intersection points in the X direction and the cells in the pair on the Y axis are equally spaced on either side of the intersection point in the Y direction. These two pairs are then mounted behind the rear projection screen so that shadows cast by the photo cells appear on the screen superimposed on the projected target image. The referred to intersection point of the X and Y axes defines the given point on which the target is to be centered.

The photo cells making up the two pairs are moved in directions towards and away from the referred to intersection point until a portion of the shadow cast by each of the cells appears in the opaque pad area of the image and the remaining portion appears in the transparent center of the image. The spacing of each of the cells in each pair from the intersection point of the orthagonal axes are maintained equal to each other.

The light responsive signals from each of the photo cells is detected and an X output signal is generated which constitutes a function of the difference in the output signals from the pair of cells lying on the X axis. Similarly, a Y output signal is generated constituting a function of the difference in the output signals from the pair of cells lying on the Y axis. These X and Y output signals are then utilized to automatically energize X and Y servo motors to shift the art work target in the X and Y directions to thereby shift the position of the image relative to the X and Y axes until the transparent center of the art work image precisely coincides with the intersection point at which time the X and Y signals are zero so that the servo motors are automatically de-energized.

One preferred apparatus for carrying out the foregoing method will now be described in detail with specific reference to the drawings.

Figure 1:
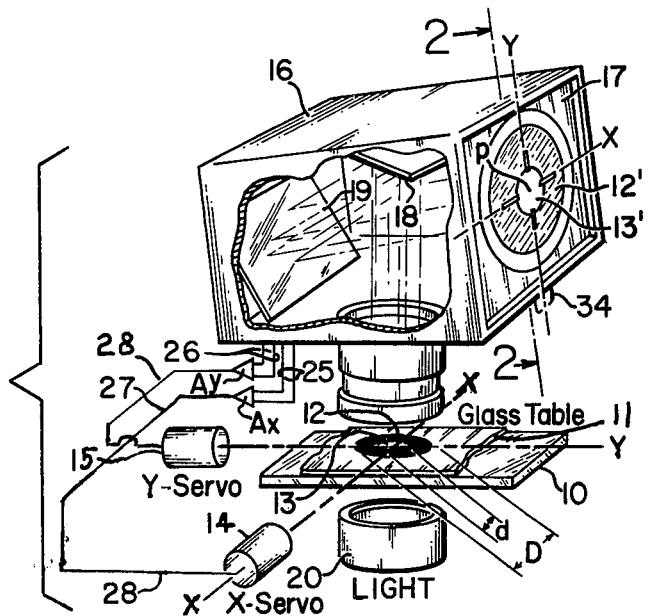
FIG. 1 is a diagramatic perspective view partly broken away of basic components of an apparatus for effecting automatic centering in accord with the present invention.

Referring first to FIG. 1, there is schematically indicated a portion of a table 10 over which a positive film 11 is positioned containing several art work targets at various locations with respect to X and Y orthagonal axes. One such art work target is shown greatly enlarged for purposes of clarity as comprising an annular opaque pad 12 with a transparent center 13.

X and Y servo motors 14 and 15 are schematically indicated as coupled to the table 10 to move the same in the direction of the X and Y axes respectively when energized. It will be understood that where the present invention is utilized in circuit board drilling operations, the circuit board itself will be carried by the table and moved into position under a drill spindle by the X and Y servo motors, the exact positioning of the board being determined by the target art work location. Thus, by precisely centering the art work target with respect to a fixed reference point, the corresponding location for hole drilling in the circuit board is precisely centered.

In FIG. 1, the reference point or given point at which the art work target is to be centered is defined by the axis of an overhead projection system comprising a projection housing 16 arranged to project an image of the art work target onto a rear projection screen 17. In the particular embodiment shown, the projection housing includes first and second mirrors 18 and 19 and a light source 20 shown positioned beneath the table 10 to project the art work target image on the first mirror for reflection to the second mirror and thence to the rear projection screen 17 so that the light path is folded within the housing 16 to provide an amplified image on the screen without having to increase the size of the housing to accommodate an equivalent straight line light path.

The given point or reference point to which the art work target is to be centered upon is defined by the intersection point of the X and Y orthagonal axes indicated on the screen 17 in FIG. 1, this intersection point being designated by the letter P. It will be clear that since the projection system 16 is stationary, slight movement of the table thereunder will shift the projected image on the rear projection screen 17 with respect to the X and Y orthogonal axes. The projected image itself on the screen is designated by the same numerals as the actual art work target followed by a prime. Thus the annular opaque pad portion is shown at 12' and the clear center at 13'.

Figure 2:
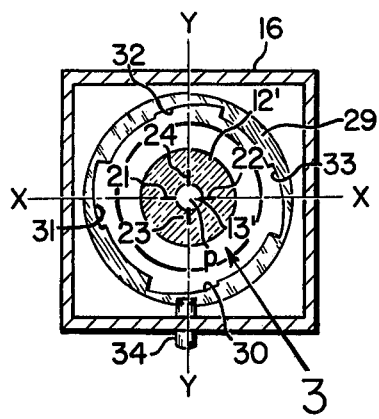
FIG. 2 is a rear cross section looking in the direction of the arrows 2—2 of FIG. 1 with various elements omitted for purposes of clarity.

Referring to the rear sectional view of FIG. 2, the housing 16 incorporates two pairs of identical elongated photo cells along the two X and Y orthogonal axes. Thus, there are schematically indicated at 21 and 22 a first pair of cells on the X axis equally spaced on either side of the intersection point P in the X direction and a second pair of cells 23 and 24 similarly equally spaced on either side of the intersection point P in the Y direction. The four cells quadrilaterally located about the center point P are physically spaced slightly downstream of the projected image on the screen 17 so that the shadows cast by the photo cells appear on the screen superimposed on the art work target image.

As will be described in detail subsequently, means are provided for moving the cells towards and away from the intersection point P maintaining the distance of the cells in each of the respective pairs precisely equidistant from the center point P. Thus, the elongated cells are positioned until a portion of the shadow cast by each of the cells appears in the opaque pad area 12' shown in FIGS. 1 and 2 and the remaining portion in the transparent center.

Light responsive electrical signals from each of the cells are detected and any difference in the two signals from the first pair of cells 21 and 22 on the X axis is utilized to drive the X servo motor of FIG. 1 and similarly any difference in the signals from the second pair of cells 23 and 24 on the Y axis is used to drive the Y servo motor of FIG. 1. Referring specifically to FIG. 1, any differential signal between the first pair of photo cells is passed on leads 25 to an X signal servo amplifier Ax to provide an X output signal and similarly any differential signal from the second pair is passed by leads 26 through a Y servo amplifier Ay to provide a Y output signal. The X and Y output signals are respectively passed by leads 27 and 28 to the X and Y servo motors 14 and 15 of FIG. 1.

From the foregoing it will be evident that if the art work target image 12', 13' is precisely centered relative to the intersection point of the X and Y axes, the light responsive signals from the first pair of cells 21 and 22 will be the same assuming that the cells are identical in construction and length and are exactly equally spaced on either side of the center point P on the X axis. Therefore, the differential or difference of the signals from these cells is zero and there will be no X signal to the X servo motor. Similarly, the signals from the second pair of cells 23 and 24 on the Y axis will be identical and thus their difference will be zero so that no signal will be passed to the Y servo motor. The table 10 will thus remain in its position wherein the target is precisely centered.

On the other hand, if the target is slightly off center, the projected image as shown in FIG. 2 will be shifted relative to the X and Y axes giving rise to difference signals in the respective pairs of photo cells, these difference signals then giving rise to the X and Y control signals on the output lines 27 and 28 to the X and Y servo motors. The servo motors will thus be energized to shift the table and the target in a manner to bring the projected target image into exact center relationship with respect to the X and Y axes at which time the difference signals will become zero so that the servo motors will automatically denergize when exact centering has taken place.

An advantage of the systems of FIGS. 1 and 2 as described is that an operator can view the exact centering operation by looking at the screen, the operator seeing essentially what the photo cells are seeing.

Since the various art work targets may be of various sizes, and since the diameter of the opaque portion relative to the diameter of the clear center may vary, it is important to be able to move the physical positions of the various photo cells described in FIG. 2 to assume proper positions wherein a portion of the cell lies in the opaque area and the remaining portion in the clear area. It is also necessary to provide a means permitting each individual cell to be shifted or moved slightly independently of the other cells in order to compensate for tolerances in the mechanical mounting arrangement for the cells as well as in the electrical properties of the cells themselves.

The manner of mounting the cells for carrying out the foregoing movements as well as the arrangement for providing the X and Y control signals from the individual cells will now be described further with respect to FIG. 2 and remaining FIGS. 3 through 6 of the drawings.

Still referring to FIG. 2, there is illustrated to the rear of the projection screen within the housing 16 a cam ring 29 having four identically shaped sloping cam surfaces 30, 31, 32 and 33 circumferentially spaced at 90° such that diametrically opposite surfaces are essentially intersected by the X and Y orthogonal axes respectively. This cam ring 29 is arranged to be rotated through a slight angle in one direction or the other by means of a handle 34 shown projecting below the housing 16 in FIG. 2.

Figure 3:
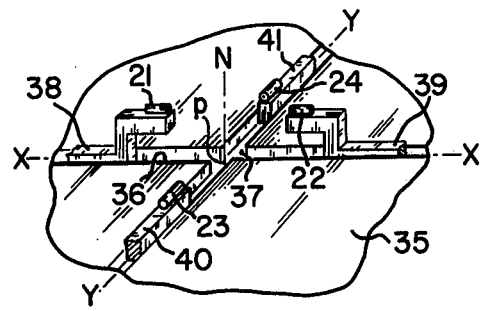
FIG. 3 is an enlarged fragmentary perspective view of the photo cell arrangement of the photo cells of FIG. 2 looking generally in the direction of the arrow 3 in FIG. 2.

Referring to FIG. 3, there is provided a transparent mounting disc 35 which may constitute part of the rear projection screen 17 and which includes orthogonal grooves 36 and 37 along the X and Y axes, these grooves intersecting at the center of the disc corresponding precisely to the point P. A first pair of elongated slide bars 38 and 39 are received in the orthogonal groove 36 along the X axis and respectively support at their inner ends the first pair of photo cells 21 and 22. Similarly, a second pair of elongated slide bars 40 and 41 are received in the groove 37 along the direction of the Y axis on either side of the intersection point P and support at their inner ends the second pair of photo cells 23 and 24.

The slide bars sliding in the grooves thus will shift the photo cells closer to or further from the intersection point P. In this respect, it will be noted that the first pair of photo cells 21 and 22 are elevated above the plane of the disc 35 to lie in a plane parallel and spaced from the plane of the second pair of photo cells 23 and 24, both planes being parallel to the plane of the disc 35. By so positioning one of the pairs of photo cells out of the plane of the other pair, they can be brought very close to the center point P without interference with each other.

As will become clearer as the description proceeds, the output electrical terminals for each of the photo cells are connected to electrical paths on the corresponding slide bars which in turn are connected at the outer ends of the bars to suitable output leads, there being provided two output leads for each of the cells.

Figure 4:
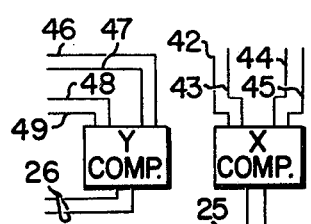
FIG. 4 is a simple block diagram illustrating the manner in which generated signals are utilized to provide X and Y servo control signals.

Referring to FIG. 4, the output leads for the photo cell 21 in the first pair of cells lying on the X axis are indicated at 42 and 43 and the output leads for the other photo cell 22 in the first pair are shown at 44 and 45. The respective signals from these cells are passed into an X comparator circuit which will provide on output leads a signal constituting a function of the difference between the signals on the leads 42, 43 and 44, 45. Thus if the electrical output from each cell in the first pair is the same, there will be no signal on the output from the X comparator.

Similarly, the terminal leads for the second pair of photo cells 23 and 24 are shown in FIG. 4 at 46, 47 and 48, 49 leading onto a Y comparator circuit which will provide on its output a signal constituting a function of any difference in the input signals. The outputs of the X and Y comparators are shown at 25 and 26 and correspond to the leads 25 and 26 described in FIG. 1 connecting to the servo amplifiers Ax and Ay respectively to provide the X and Y output signals to the servo motors.

Figure 5:
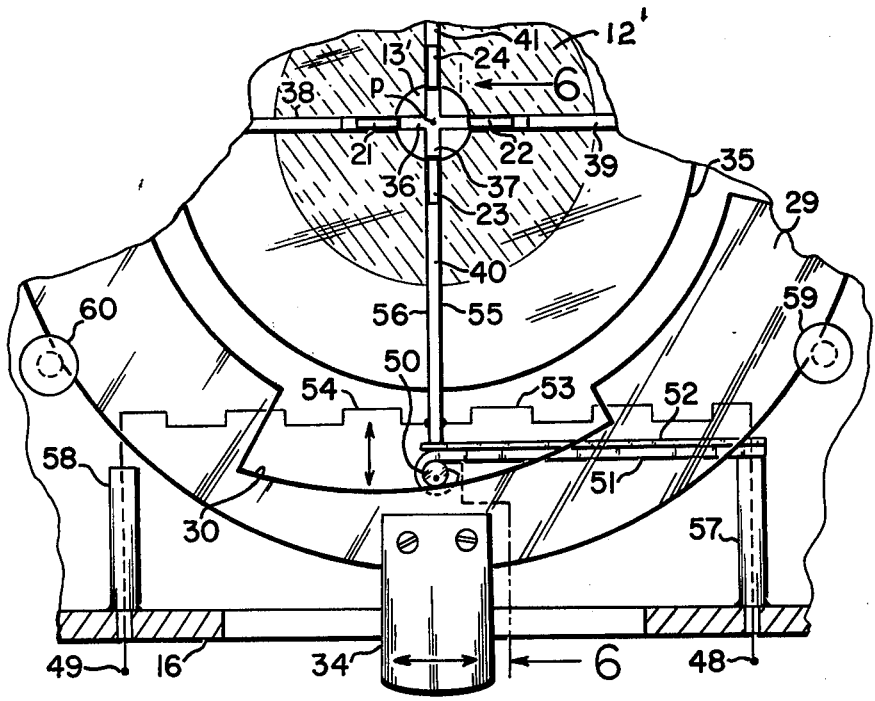
FIG. 5 is an enlarged fragmentary front elevatinal view of a portion of the view of FIG. 2 illustrating one means of controlling the positions of the photo cells in accord with this invention; and, FIG. 6 is a fragmentary cross section taken in the direction of the arrows 6—6 of FIG. 5.

Referring now the the enlarged fragmentary view of FIG. 5, the manner in which the cam ring cooperates with the slide bars to provide desired movements of the photo cells will be understood. FIG. 5 is a rear view similar to FIG. 2 but showing only the lower central portion thereof in detail. It is to be understood, accordingly, that the view is taken as though one were within the housing 16 looking towards the rear projection screen 17 onto which the art work target image is projected. Thus, there is shown the transparent disc 35 containing the orthogonal grooves 36 and 37 supporting the pairs of slide bars 38, 39 and 40, 41 respectively. The project target image is again illustrated at 12' and 13' and it will be noted that the first and second pairs of elongated photo cells are each positioned with a portion of the cell in the opaque area 12' with the remaining portion in the clear center 13'. The outer ends of the slide bars in turn terminate juxtaposed the sloping cam surfaces of the cam ring 29. Since the movement of each of the slide bars by the cam ring is identical, a detailed description of one will suffice for all. Thus, with respect to the slide bar 40, the outer end thereof terminates in a cam follower 50 engaging the sloping cam surface 30. A thin metallic leaf spring 51 in turn extends on top of the cam follower to urge it along with the connected slide bar 40 radially outwardly into engagement with the sloping surface 30. In order to avoid grounding of the electrical paths of the slide bar to the casing, there is provided an overlying strip of insulation 52 on the leaf spring 51. The electrical signals from the photo cell 23 on the slide bar 40 are picked off the slide bar by flat lead springs 53 and 54 which are bent into a circuitous path so that they can stretch or retract upon rotation of the cam ring 29. These pick off springs connect to suitable conducting paths 55 and 56 on opposite sides of the slide bar 40 connected to the photo cell 23. They also mechanically hold the slide bars in their slots and force the slide bars outward against the insulating strips 52. Suitable supports 57 and 58 receive the ends of the springs 53 and 54 to pass them out from the housing 16 as indicated at 48 and 49, these latter leads corresponding to those described in conjunction with FIG. 4 passing to the Y comparator.

The cam ring 29 itself is rotationally supported as by peripheral clips 59 and 60 such that the cam ring can be rotated by the handle 34 over a short arcuate distance. Because of the sloping cam surface 30, it will be evident that movement of the handle 34 to the left as viewed in FIG. 5 to rotate the cam ring 29 in a clockwise direction will result in the slide bar 40 being cammed upwardly to move the photo cell 23 towards the intersection point P. Similarly, movement of the cam ring 29 in an opposite or counter-clockwise direction as viewed in FIG. 5 by the handle 34 will cause the slide bar 40 to move radially outwardly to move the photo cell 23 away from the intersection point P.

Since the remaining sloping cam surfaces are identically constructed and correspondingly juxtaposed the outer ends of the remaining slide bars, all of the photo cells will be moved simultaneously inwardly or outwardly upon rotation of the cam ring.

Figure 6:
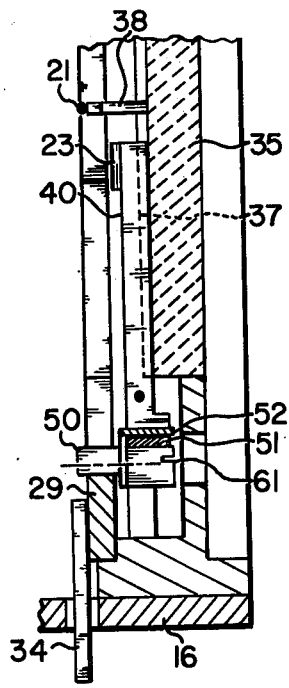

FIG. 6 illustrates in fragmentary side view the elements described in FIG. 5, the corresponding elements being designated by the same numerals. It will be noted in FIG. 6 that the cam follower 50 is in the form of a member which is eccentrically mounted for rotation in place within a curled end portion of the leaf spring 51. A screwdriver slot 61 is disposed at the right end of the member 50 as viewed in FIG. 6 to permit rotation of the eccentrically mounted member in place which will thereby exert a slight lifting movement on the slide bar 40 without in any way changing the position of the cam ring itself. It will thus be evident that small individual adjustments of the positions of the photo cells can be made to equalize their signals when the intersection point coincides with the exact center of the projected target image to compensate for mechanical and electrical errors arising from given tolerances.

With respect to the foregoing, it will be understood that each of the photo cells are made as identical as possible in length and electrical characteristics. Thus, the cells should each generate the same signal when radiated by the same amount of light. Similarly, the signal will proportionately decrease as portions only of the elongated cells are exposed. Thus in the set-up as illustrated in FIG. 5, if the photo cell 23 should have more of its length within the transparent target area 13' than the photo cell 24, its signal will be different from that of the cell 24. In establishing the correct initial positions for the cells relative to the intersection point P, in the event the cells are not all absolutely identical as is the ideal case, the adjustment of the eccentric cam member can be effected to shift the cells slightly and thus equalize the signals when exact centering is taking place. Thereafter, the system is properly calibrated for the particular target involved and equalizations of all signals from the cells will result when exact positioning takes place for subsequent targets.

OPERATION

The operation of this invention will be evident from the foregoing description. Initially, the table is operated by the servo motors in FIG. 1 to effect an approximate positioning of the art work target under the projection system. The exact final positioning is then effected automatically by the photo cells which are positioned as described so that difference signals are generated from the two pairs on the X and Y axes respectively in the event of any off-centering in these directions. These difference signals as described will operate the servos in directions to shift the image relative to the intersection point in a manner to effectively null the difference signals.

From the foregoing description, it will thus be evident that the present invention has provided a greatly improved projection scope and positioning system.

While a detailed example of the invention has been set forth, its essence resides in the provision of two photo cells in each of two axes which compare the amount of light falling on them to indicate the centering of a projected and magnified spot. The cells are slightly downbeam from a rear projection screen but still approximately in focus and share the projected image with the rear projection screen. They further have means to shift toward or away from the center of the screen to accommodate different hole and pad sizes of the target.

Some of the advantages of the present invention over previous systems may be summarized as follows:

First, the operator can see exactly what the photo cells are seeing and therefore can adjust them to optimum position for a particular target size.

Second, the photo cell polarities can be reversed to make the system zero in an opaque dot rather than a clear dot or center of the target image.

Third, since the photo cells are neither switched nor rotated in a time sharing procedure, the response time in the present invention is reduced for faster zeroing in or centering.

Fourth, no beam splitter or extra lenses are required to give a separate image for the visual and electronic eye outputs so that the system is simpler and can be manufactured with less expense than required heretofore.

What is claimed is:

1. A method for automatically positioning an art work target in the form of an annular opaque pad having a transparent center at the precise center of a given point and visually viewing the centering operation, including the steps of:
   a. projecting an image of the art work target onto a rear projection screen;
   b. positioning two pairs of identical elongated photo cells along two X and Y orthogonal axes respectively at points equally spaced a given distance from the intersection point of said orthogonal axes so that the photo cells in the pair on the X axis are equally spaced on either side of the intersection point in the X direction and the photo cells in the pair on the Y axis are equally spaced on either side of the intersection point in the Y direction;
   c. mounting said two pairs of photo cells behind the rear projection screen so that the shadows cast by said photo cells appear on said screen superimposed on said image, said intersection point of said X and Y axes defining said given point on which said target is to be centered;
   d. moving said photo cells making up said two pairs in directions towards and away from said intersection point until a portion of the shadow cast by each of said cells appears in the opaque pad area of said image and the remaining portion appears in the transparent center of said image, the equal spacing of the photo cells from said intersection point being maintained;
   e. detecting the light responsive signals from each of said photo cells;

f. generating an X output signal constituting a function of the difference in the output signals from said pair of cells lying on said X axis;

g. generating a Y output signal constituting a function of the difference in the output signals from said pair of cells lying on said Y axis, and, h. automatically energizing X and Y servo motors with said X and Y output signals to shift said art work target in X and Y directions to thereby shift the position of said image relative to said X and Y axes until the transparent center of said art work image precisely coincides with said intersection point at which time the X and Y signals are zero so that said servo motors are automatically de-energized.

2. An apparatus for automatically positioning an art work target in the form of an annular opaque pad having a transparent center at the precise intersection point of X and Y orthogonal axes, and viewing the centering operation, including in combination:

a. a table supporting said art work target;

b. X and Y servo motors coupled to said table to move it along said X and Y orthogonal axes respectively when energized;

c. stationary projection means, including a rear projection screen, positioned relative to the art work target on said table to provide an image of said art work target on said screen, said screen having indicated thereon said X and Y orthogonal axes;

d. a first pair of elongated photo cells movably mounted in said projection means behind said screen in positions equally spaced along said X axis on either side of said intersection point of said X and Y orthagonal axes;

e. a second pair of elongated photo cells movably mounted in said projection means behind said screen in positions equally spaced along said Y axis on either side of said intersection point, the shadows cast by said photo cells on said rear projection screen being superimposed on said image projected on said screen of said art work target;

f. means for adjusting the positions of said elongated cells along said X and Y orthagonal axes so that a portion of each cell lies in the annular opaque pad portion of said art work target and the remaining portion lies in the transparent center portion thereof; and g. a servo motor energizing means connected to said photo cells and responsive to differences in the signals generated by said first pair of photo cells to provide an X output signal to said X servo motor and responsive to differences in the signals generated by said second pair of photo cells to provide a Y output signal to said y servo motor whereby said table will be automatically moved until the transparent center of said art work target is precisely positioned at the intersection point of said X and Y orthagonal axes at which time said X and Y output signals become zero so that said servo motors are automatically de-energized.

3. An apparatus according to claim 2, in which said projection means includes a housing incorporating first and second mirrors, and a light source positioned to project said image on said first mirror for reflection to the second mirror and thence to said rear projection screen so that the light path is folded within said housing to thereby provide an amplified image on said screen without having to increase the size of the housing to accommodate an equivalent straight line light path.

4. An apparatus according to claim 2, in which said rear projection screen includes a transparent mounting disc, said means for adjusting the positions of said elongated cells along said X and Y orthogonal axes including orthogonal grooves formed in said mounting disc along said X and Y orthogonal axes, said grooves intersecting at the center of said disc to define said intersection point of said X and Y orthogonal axes; a first pair of elongated slide bars received in the orthogonal groove along said X axis and respectively supporting at their inner ends said first pair of photo cells on either side of said intersection point; a second pair of elongated slide bars received in the other of said orthogonal grooves along said Y axis and respectively supporting at their inner ends said second pair of photo cells on either side of said intersection point; and a cam ring having four identically shaped sloping cam surfaces circumferentially spaced at 90° in positions respectively juxtaposed to the outer ends of said slide bars adjacent to the periphery of said disc, each of said slide bars terminating at its outer end in a cam follower engaging the juxtaposed sloping cam surface whereby rotation of said cam ring in one direction simultaneously moves said slide bars radially inwardly to move said photo cells closer to said intersection point and rotation of said cam ring in an opposite direction simultaneously moves said slide bars radially outwardly to move said photo cells further away from said intersection point.

5. An apparatus according to claim 4, in which each of said cam followers constitutes an eccentrically mounted member which may be individually rotated in place to move only its associated slide bar and photo cell without changing the position of said cam ring whereby small individual adjustments of the positions of the photo cells can be made to equalize their signals when said intersection point coincides with said given point to thereby compensate for mechanical and electrical errors arising from given tolerances.

6. An apparatus according to claim 2, in which said servo motor energizing means includes X and Y comparators each having two inputs and one output, the signals from said first pair of photo cells being received in said two inputs of said X comparator, a signal appearing at said output of said X comparator corresponding to the difference between the signals received at the inputs; an X servo signal amplifier connected to said output to provide said X signal; the signals from said second pair of photo cells being received in the two inputs of said Y comparator, a signal appearing at the output of the Y comparator corresponding to the difference between the signals received at the inputs of the Y comparator; and a Y servo signal amplifier connected to said output of the Y comparator to provide said Y signal.

7. An apparatus according to claim 4, in which the photo cells in one pair are supported by their slide bars in a plane parallel to and spaced from the plane of the photo cells in the other pair, both of said planes being parallel to the plane of said mounting disc, so that the cells in one pair will not interfere with movement of the cells in the other pair when the inner ends of the slide bars are moved extremely close to said intersection point.

* * * * *